United States Patent
Ahmed et al.

(10) Patent No.: US 10,288,661 B2
(45) Date of Patent: May 14, 2019

(54) METHOD FOR TESTING THE TRANSMISSION AND REFLECTION PROPERTIES OF AN AUTOMOTIVE RADOME BODY AS WELL AS APPARATUS FOR TESTING THE TRANSMISSION AND REFLECTION PROPERTIES OF AN AUTOMOTIVE RADOME BODY

(71) Applicant: Rohde & Schwarz GmbH & Co. KG, Munich (DE)

(72) Inventors: Sherif Ahmed, Starnberg (DE); Tobias Koeppel, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/621,119

(22) Filed: Jun. 13, 2017

(65) Prior Publication Data
US 2017/0356941 A1    Dec. 14, 2017

(30) Foreign Application Priority Data

Jun. 14, 2016 (EP) ..................... 16174449

(51) Int. Cl.
| | |
|---|---|
| *H01Q 1/42* | (2006.01) |
| *G01R 29/10* | (2006.01) |
| *G01N 23/06* | (2018.01) |
| *G01S 7/40* | (2006.01) |
| *G01R 27/28* | (2006.01) |

(Continued)

(52) U.S. Cl.
CPC .............. *G01R 29/10* (2013.01); *G01N 23/06* (2013.01); *G01R 27/28* (2013.01); *G01R 29/0878* (2013.01); *G01S 7/4004* (2013.01); *H01Q 1/421* (2013.01); *G01S 2013/9375* (2013.01)

(58) Field of Classification Search
CPC .......... H01Q 1/42; H01Q 1/421; G01R 29/10; G01R 29/0878; G01R 27/28
See application file for complete search history.

(56) References Cited

U.S. PATENT DOCUMENTS

| | | | | |
|---|---|---|---|---|
| 5,371,505 A | * | 12/1994 | Michaels | ................. H01Q 1/42 324/639 |
| 2009/0237092 A1 | | 9/2009 | Zoughi et al. | |
| 2015/0349414 A1 | * | 12/2015 | Tagi | ......................... G01S 7/03 343/872 |

OTHER PUBLICATIONS

Extended European Search Report dated Dec. 1, 2016, issued in priority European Application No. 16174449.5, filed Jun. 14, 2016, 10 pages.

* cited by examiner

*Primary Examiner* — Hoang V Nguyen
(74) *Attorney, Agent, or Firm* — Christensen O'Connor Johnson Kindness PLLC

(57) ABSTRACT

A method for testing the transmission and reflection properties of an automotive radome body is described. An automotive radome body is placed at an installation location. A first signal is sent via at least one transmission antenna of an antenna system facing a first side of the radome body wherein the reflected part of the first signal is received by several receiving antennas of the antenna system facing the first side in order to determine the reflection properties of the radome body. A second signal is sent via a remote transmission antenna facing a second side of the radome body being opposite to the first side wherein the transmitted part of the second signal is received by the several receiving antennas of the antenna system in order to determine the transmission properties of the radome body. Further, an apparatus is described.

20 Claims, 1 Drawing Sheet

(51) Int. Cl.
*G01R 29/08* (2006.01)
*G01S 13/93* (2006.01)

METHOD FOR TESTING THE TRANSMISSION AND REFLECTION PROPERTIES OF AN AUTOMOTIVE RADOME BODY AS WELL AS APPARATUS FOR TESTING THE TRANSMISSION AND REFLECTION PROPERTIES OF AN AUTOMOTIVE RADOME BODY

FIELD OF THE DISCLOSURE

Embodiments of the present disclosure relate generally to a method for testing the transmission and reflection properties of an automotive radome body as well as to an apparatus for testing the transmission and reflection properties of an automotive radome body.

BACKGROUND

In general, automotive radome bodies are used to protect antennas, in particular radar antennas, from environmental effects such as wind and/or rain. Typically, motor vehicles have a radar system at their front wherein the radar system is protected by a radome body which is also disposed at the front of the motor vehicle. The radar system is used to detect another motor vehicle or any other object in front of the motor vehicle. Accordingly, the radar system comprises at least one transmitting antenna for transmitting a radar signal as well as at least one receiving antenna for receiving a reflected signal. Both antennas are protected by the same automotive radome body. Usually, the antennas are working with a frequency between 77 GHz and 79 GHz, in particular 77 GHz or 79 GHz.

Since customers can see the radome body at the front of the motor vehicle, the radome body should have an attractive design wherein the logo of the manufacturer is typically integrated, for instance. Thus, the radome body should have excellent optical quality with regard to design purposes, but it is also indispensable that the radome body stays transparent for radar signals of the antennas disposed behind the radome body as well as the reflected radar signals.

However, the radar signals, in particular their propagation, can be disturbed due to the design of the radome body, in particular due to certain shapes and/or materials used. For example, the maximum range of detection can be reduced and/or the angle accuracy of objects to be detected can be degraded which result in poor performance of the whole radar system of the motor vehicle. Accordingly, the range sensitivity and the angle accuracy of detection are impaired.

Usually, the radome body is analyzed in order to determine its transmission and reflection properties. Therefore, the radome body is placed in front of a transmission antenna wherein the reflection properties are measured. Alternatively, the transmission properties are measured by placing a receiving antenna behind the radome body in order to determine the transmission properties. Until now, this information is deemed to be sufficient.

However, these measurements do not provide enough information regarding the attenuation and/or homogeneity of the radome body, in particular with regard to angle dependency.

SUMMARY

Embodiments of the present disclosure provide, inter alia, a method for testing the transmission and reflection properties of an automotive radome body, wherein an automotive radome body is placed at an installation location. A first signal is sent, referred to as step b, via at least one transmission antenna of an antenna system facing a first side of the radome body wherein the reflected part of the first signal is received, referred to as step c, by several receiving antennas of the antenna system facing the first side in order to determine the reflection properties of the radome body. Further, a second signal is sent, referred to as step d, via a remote transmission antenna facing a second side of the radome body being opposite to the first side wherein the transmitted part of the second signal is received, referred to as step e, by the several receiving antennas in order to determine the transmission properties of the radome body.

Embodiments of the present disclosure are based on the finding that more information about the automotive radome body can be gathered when signals to be analyzed are sent from both sides of the radome body, in particular from the transmission side and the reception side of the automotive radome body. The reception side of the radome body corresponds to the first side of the installation location whereas the transmission side of the radome body corresponds to the second side of the installation location. Therefore, both sides of the radome body are tested in order to obtain a full quality analysis of the radome body with regard of transmitted signals as well as received signals. This testing can be performed in production plants of manufacturers of motor vehicles and/or in production plants of manufacturers of automotive radome bodies.

The measurements according to steps b) and c) enable to get a radio frequency mm-image being similar to an optical picture of the radome body.

In general, the first signal can be used to determine the reflection properties on the reception side of the automotive radome body since the several receiving antennas facing the first side receives the reflected part of the first signal. The second signal can be used to determine the transmission properties of the radome body, in particular on the transmission side of the automotive radome body, since the several receiving antennas facing the first side receives the transmitted part of the second signal. Accordingly, the angular behavior can be determined since an angular depending image of the radome body may be generated. This angular depending image is based on the reflection properties on the reception side of the radome body, in particular its homogeneity, and the transmission properties of the radome body on the transmission side.

The above mentioned steps b) and c) can also be executed after steps d) and e). Hence, the order of the signals which will be sent is interchangeable.

Particularly, the transmitted part of the second signal in step d) is analyzed in order to determine the angle dependency of the transmission properties of the radome body on its transmission side. Due to this measurement, critical areas of the radome body can be detected at an early stage in order to identify areas which are not transparent for radar signals.

For instance, the transmitted part of the second signal sent by the remote transmission antenna can be detected by the several receiving antennas wherein each of the several receiving antennas detects a certain amplitude of the deflected second signal which has propagated through and/or along the radome body.

Moreover, the beam deformation of the transmitted second signal can be analyzed by variable attenuation. Thus, the attenuation level is successively set to certain values in order to detect which of the several receiving antennas of the antenna system detects a transmitted second signal or which ones do not detect any signal anymore at a certain value. Accordingly, information about the angle dependency can be gathered.

In general, the angular dependency of the radome body may be determined by measuring the attenuation of the transmitted signals.

The reflected part of the first signal received by the receiving antennas can be analyzed in order to get information about homogeneity and/or impedance matching of the radome body. Thus, the first signal which is sent by the at least one transmission antenna can be analyzed such that a three-dimensional image of the radome body is generated. This image of the radome body may be analyzed in order to gather information about the homogeneity and matching of the radome body.

Further, at least the remote transmission antenna is switched off during step b), in particular during steps b) and c). The remote transmission antenna does not send any signals during step b), in particular during steps b) and c). Accordingly, the reflection properties of the radome body on its reception side can be analyzed without any disturbance due to a signal sent by the remote transmission antenna.

According to an aspect, a third signal is sent by the remote transmission antenna. This third signal can be used to determine the reflection and/or transmission properties of the radome body on its transmission side.

Moreover, a remote receiving antenna facing the second side of the radome body is provided which receives reflected and/or transmitted signals. This remote receiving antenna can be used to determine reflection properties of the radome body on its transmission side and/or transmission properties of the radome body on its reception side. Accordingly, more information about the radome body is gathered which can be used to generate a more detailed analysis of the radome body.

The reflected part of the third signal may be received by the remote receiving antenna. Thus, this signal can be used to determine the reflection properties of the radome body on its transmission side. This third signal can be sent before step b), after step c) and/or after step e). Once again, the order of the signals to be sent is not fixed since the signals can be sent in a different order.

The third signal and the second signal may be the same. Thus, the transmitted part of this signal is received by the several receiving antennas wherein the reflected part of this signal is received by the remote receiving antenna, simultaneously. Accordingly, the transmission and reflection properties on the transmission side of the radome body can be determined in one step, simultaneously.

According to another aspect, the remote receiving antenna is switched on during step b) in order to receive a transmitted part of the first signal. In general, the transmission properties of the radome body can be analyzed since the remote receiving antenna detects the part of the first signal which has been transmitted through and propagated along the radome body, respectively. Thus, the reflection and transmission properties of the radome body on its reception side can be determined, simultaneously. Only the at least one transmission antenna facing the first side emits a signal during step b).

According to a preferred embodiment, several transmission antennas are provided which are facing the first side. The several receiving and the several transmission antennas form the antenna system which faces the first side of the installation location and the reception side of the radome body, respectively. The several antennas are positioned with regard to the installation location such that measurements can be executed in order to gather information about the angular dependencies of the radome body. Thus, it is ensured that an angular dependency of the radome body regarding its reflection and transmission properties can be determined.

Particularly, the transmitted part of the first signal received by the remote receiving antenna is analyzed in order to determine the angle dependency of the transmission properties of the radome body on its reception side. This is possible if several transmission antennas are provided which are facing the first side being opposite to the second side on which the remote receiving antenna is positioned. Each of the first signals sent by the several transmission antennas impairs the radome body under a certain angle. Accordingly, the remote receiving antenna receives several transmitted signals which are sent by the several transmission antennas during step b).

According to another aspect, a calibration step is performed, in particular before step a) and/or after step e), wherein no radome body is located at the installation location. This calibration step is performed in order to determine if the used antennas are working well. In case deviations were detected, the whole apparatus for executing the method can be calibrated. If the calibration step is performed after step e), the gathered data can be recalculated after the calibration step such that possible deviations are considered. Thus, the calibration step corresponds to a normalization step. In other words, it is determined during the calibration step what will be measured by the apparatus if no automotive radome body is placed at the installation location.

Further, embodiments of the present disclosure provide an apparatus for testing the transmission and reflection properties of an automotive radome body wherein the apparatus comprises an installation location for the automotive radome body, an antenna system, at least one remote receiving antenna as well as at least one remote transmitting antenna wherein the antenna system is located such that it faces a first side of the installation location whereas the remote antennas are located such that they face a second side of the installation location being opposite to the first side. Accordingly, the radome body to be analyzed is placed between the antenna system and the remote antennas ensuring that the radome body can be scanned from both sides of the automotive radome body. This ensures to determine the transmission and reflection properties on the reception side as well as on the transmission side of the automotive radome body.

According to another aspect, a control unit is provided to which the antenna system and the remote antennas are connected such that they can be controlled independently. Thus, the antenna system and/or one of the remote antennas can be switched off during certain test steps in order to transmit and/or receive only signals which are used to determine certain property of the radome body. For instance, the remote transmitting antenna should be switched off when the reflection properties on the reception side of the automotive radome body or the transmission properties on the reception side of the automotive radome body are determined.

Further, the antenna system can comprise at least one transmitting antenna and at least one receiving antenna, in particular several transmitting antennas and/or receiving antennas. This ensures that the transmission and reflection properties on the transmission side of the radome body can be measured by the antenna system. In addition, the several transmission and/or receiving antennas ensure that the angular dependency of the radome body can be analyzed in detail, in particular on its reception side as well as on its transmission side.

The at least one transmission antenna and the at least one receiving antenna may be disposed in a common device, in particular in a millimeter wave active imaging device. Such a device can be 1 m high and 1 m wide.

Hence, the device can comprise several hundred antennas, for instance between 1,000 and 2,000 receiving antennas and transmission antennas, respectively. In particular, 1,500 receiving antennas and 1,500 transmission antennas are provided. This ensures that the angular dependency can be measured and determined with high accuracy. A resolution of less than 2 mm is ensured by such a device.

In addition a system for testing the transmission and reflection properties of an automotive radome body is provided which comprises the automotive radome body to be tested and an apparatus for testing the transmission and reflection properties of the automotive radome body as described above.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawing, wherein

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
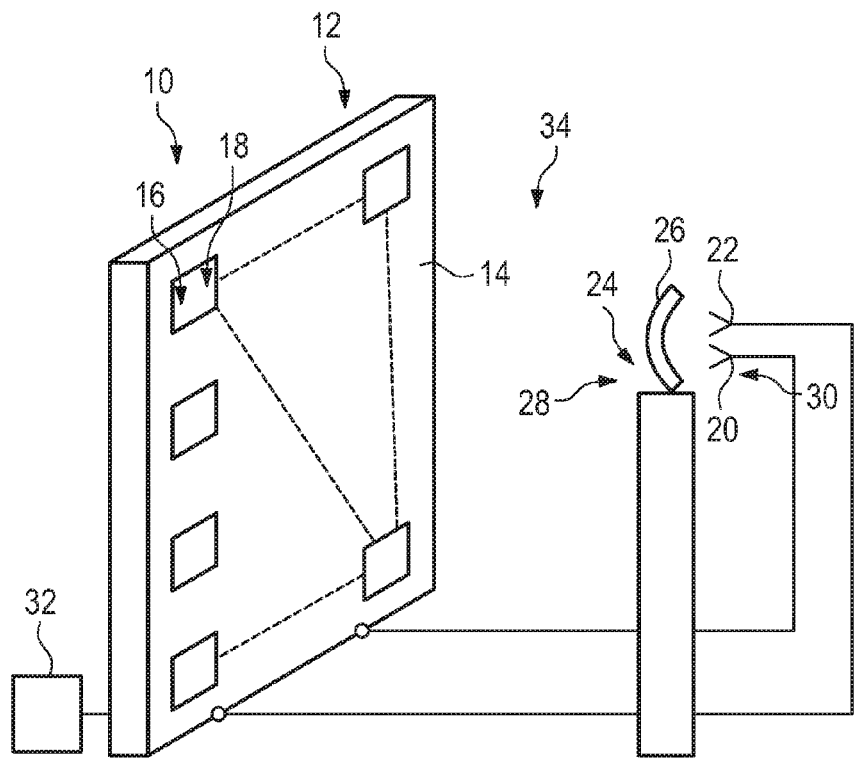
FIG. 1 shows a schematic view of one representative embodiment of an apparatus according to an aspect of the of the disclosed technology.
Figure 2:
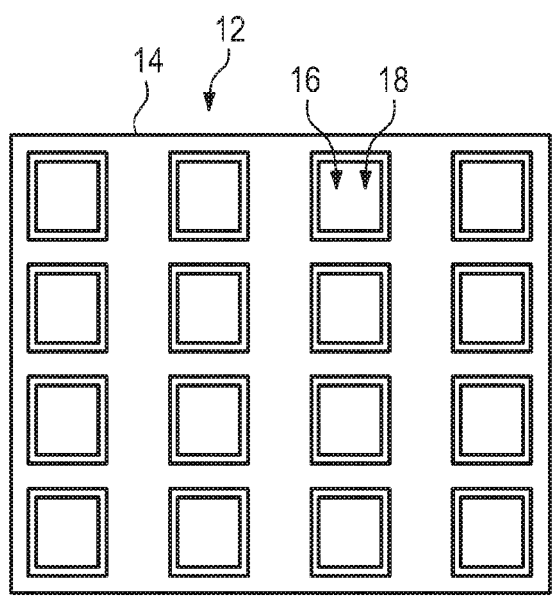
FIG. 2 shows a perspective view of one representative embodiment of an antenna system used for the apparatus.

FIG. 1 schematically shows an apparatus 10 for testing transmission and reflection properties of an automotive radome body according to an embodiments of the present disclosure. The apparatus 10 comprises an antenna system 12 which is formed in a common device 14 according to the shown embodiment (please refer to FIG. 2).

In the shown embodiment, the common device 14 is a millimeter wave active imaging device which comprises several transmission antennas 16 as well as several receiving antennas 18. Each of the illustrated squares comprises several transmission antennas 16 and receiving antennas 18. For instance, a number of, e.g., 100, transmission antennas 16 and receiving antennas 18 can be provided in each of the squares. In some embodiments, the transmission antennas 16 and the receiving antennas 18 are positioned in a common plane.

The apparatus 10 also comprises a remote receiving antenna 20 as well as a remote transmission antenna 22, which are positioned next to each other, for instance side by side. Moreover, the apparatus 10 has an installation location 24 at which an automotive radome body 26 used in a motor vehicle can be placed to be measured by the apparatus 10.

In FIG. 1, the automotive radome body 26 is placed at the installation location 24 such that the antennas 16, 18 of the antenna system 12 are facing the reception side of the radome body 26 corresponding to a first side 28 whereas the remote antennas 20, 22 are facing the transmission side of the radome body 26 corresponding to a second side 30. In this context, the first and second sides 28, 30 of the radome body 26 are similar to the first and second side of the installation location 24.

In addition to the antenna system 12 and the remote antennas 20, 22, the apparatus 10 further comprises a control unit 32 which is connected to the antenna system 12, and in some embodiments, the several transmission antennas 16 and receiving antennas 18, as well as the remote receiving antenna 20 and the remote transmitting antenna 22. The control unit 32 and the several antennas 16, 18, 20, 22 are configured such that each of the antennas 16, 18, 20, 22 can be controlled individually.

Accordingly, the apparatus 10 can be used to execute a method for testing the transmission and reflection properties of the automotive radome body 26. The shown apparatus 10 and the automotive radome body 26 to be tested represent a system 34.

The method to be carried out by the apparatus 10, inter alia, comprises sending a first signal via the several transmission antennas 16 of the antenna system 12 facing the first side 28 and the reception side of the radome body 26 wherein the reflected part of the first signal is received by the several receiving antennas 18 facing the first side 28 in order to determine the reflection properties of the radome body 26 on its transmission side. A second signal is sent via the remote transmission antenna 22 facing the second side 30 being opposite to the first side 28 wherein the transmitted part of the second signal is received by the several receiving antennas 18 in order to determine the transmission properties of the radome body 26 on its transmission side.

In addition, the remote transmission antenna 20 can be used to send a third signal which reflected part is received by the remote receiving antenna 22. Thus, the reflection properties of the radome body 26 on its reception side can be determined.

The third signal can be the same one as the second signal. Thus, the remote transmission antenna 20 only sends one signal which reflected part is received by the remote receiving antenna 22 and its transmitted part is received by the receiving antennas 18 facing the first side 28. Both measurements can be done, simultaneously.

The angular dependency of the transmission properties of the radome body 26 on its transmission side can be determined as several receiving antennas 18 are used. Further, the homogeneity of the radome body 26 can be determined easily since the reflected part of the first signal is received by the several receiving antennas 18 covering a wide angular range.

Since the antenna system 12 comprises several transmission antennas 16, the angular dependencies of the transmission properties of the radome body 26 on the reception side can also be measured and evaluated. The several transmission antennas 16 also cover a wide angular range.

Usually, the transmission antennas 16 as well as the remote transmission antenna 20 send radar signals having a frequency of 77 GHz or 79 GHz. However, a wide range of 68 GHz to 82 GHz can be used by the apparatus 10 for testing purposes.

The installation location 24 can comprise a holder or similar structure in order to hold the radome body 26 to be tested.

The tests may be carried out to determine and localize defects in the radome body 26. Further, these tests can be performed during the designing phase of a new radome body in order to verify if the design is transparent for radar signals ensuring a good working radar system in the motor vehicle.

A method and an apparatus are provided which can be used to gather information regarding the attenuation of the radome body, and in some embodiments, its angular dependency, as well as information about the homogeneity of the radome body regarding waves propagating through the radome body in real operation.

In an embodiment, the angular dependency of the transmission properties can be measured on the reception side and on the transmission side of the radome body. Further, the total reflectivity of the reception side and the transmission side of the radome body is determined by the several measurements. Thus, full quality examination/analysis of the radome body can be performed, especially in production plants.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for testing the transmission and reflection properties of an automotive radome body, comprising the following steps:
    a) placing an automotive radome body at an installation location,
    b) sending a first signal via at least one transmission antenna of an antenna system facing a first side of said radome body, wherein
    c) the reflected part of said first signal is received by several receiving antennas of said antenna system facing said first side in order to determine the reflection properties of said radome body, and
    d) sending a second signal via a remote transmission antenna facing a second side of said radome body being opposite to said first side, wherein
    e) the transmitted part of said second signal is received by said several receiving antennas in order to determine the transmission properties of said radome body.

2. The method according to claim 1, wherein the transmitted part of said second signal in step d) is analyzed in order to determine the angle dependency of the transmission properties of said radome body on its transmission side.

3. The method according to claim 1, wherein the reflected part of the first signal received by said receiving antennas is analyzed in order to obtain information about at least one of homogeneity and impedance matching of said radome body.

4. The method according to claim 1, wherein at least said remote transmission antenna is switched off during step b).

5. The method according to claim 1, wherein at least said remote transmission antenna is switched off during steps b) and c).

6. The method according to claim 1, wherein a third signal is sent by said remote transmission antenna.

7. The method according to claim 6, wherein the reflected part of said third signal is received by said remote receiving antenna.

8. The method according to claim 1, wherein a remote receiving antenna facing said second side of said radome body is provided which receives at least one of reflected and transmitted signals.

9. The method according to claim 8, wherein said remote receiving antenna is switched on during step b) in order to receive a transmitted part of said first signal.

10. The method according to claim 1, wherein several transmission antennas are provided which are facing said first side.

11. The method according to claim 10, wherein the transmitted part of said first signal received by said remote receiving antenna is analyzed in order to determine the angle dependency of the transmission properties of said radome body on its reception side.

12. The method according to claim 1, wherein a calibration step is performed, wherein no radome body is located at said installation location.

13. The method according to claim 12, wherein the calibration step is performed at least one of before step a) and after step e).

14. An apparatus for testing the transmission and reflection properties of an automotive radome body, wherein said apparatus comprises:
    an installation location for said radome body;
    an antenna system;
    at least one remote receiving antenna as well as at least one remote transmitting antenna,
    wherein said antenna system is located such that it faces a first side of said installation location whereas said remote antennas are located such that they face a second side of said installation location being opposite to said first side.

15. The apparatus according to claim 14, wherein a control unit is provided to which said antenna system and said remote antennas are connected such that they can be controlled independently.

16. The apparatus according to claim 14, wherein said antenna system comprises at least one transmission antenna and at least one receiving antenna.

17. The apparatus according to claim 14, wherein said antenna system comprises at least one of several transmission antennas and several receiving antennas.

18. The apparatus according to claim 14, wherein said at least one transmission antenna and said at least one receiving antenna are disposed in a common device.

19. The apparatus according to claim 18, wherein said at least one transmission antenna and said at least one receiving antenna are disposed in a millimeter wave active imaging device.

20. A method for testing the transmission and reflection properties of an automotive radome body, comprising the following steps:
- placing an automotive radome body at an installation location,
- sending a first signal via at least one transmission antenna of an antenna system facing a first side of said radome body, wherein the reflected part of said first signal is received by several receiving antennas of said antenna system facing said first side in order to determine the reflection properties of said radome body, and
- sending a second signal via a remote transmission antenna that is separately formed with respect to the antenna system, said remote transmission antenna facing a second side of said radome body being opposite to said first side, wherein the transmitted part of said second signal is received by said several receiving antennas in order to determine the transmission properties of said radome body.

* * * * *